(12) United States Patent
Chen et al.

(10) Patent No.: US 12,444,647 B2
(45) Date of Patent: *Oct. 14, 2025

(54) ELECTRON MIGRATION CONTROL IN INTERCONNECT STRUCTURES

(71) Applicant: Taiwan Semiconductor Manufacturing Company, Ltd., Hsinchu (TW)

(72) Inventors: Chun-Jen Chen, Hsinchu (TW); Kai-Shiung Hsu, Hsinchu (TW); Ding-I Liu, Hsinchu (TW); Jyh-nan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/227,726

(22) Filed: Jul. 28, 2023

(65) Prior Publication Data

US 2023/0377955 A1    Nov. 23, 2023

Related U.S. Application Data

(63) Continuation of application No. 17/682,823, filed on Feb. 28, 2022, which is a continuation of application
(Continued)

(51) Int. Cl.
*H01L 21/768* (2006.01)
*H01L 23/522* (2006.01)
*H01L 23/532* (2006.01)

(52) U.S. Cl.
CPC .. *H01L 21/76826* (2013.01); *H01L 21/76832* (2013.01); *H01L 21/76834* (2013.01);
(Continued)

(58) Field of Classification Search
CPC .......... H01L 23/5226; H01L 21/76849; H01L 21/76834; H01L 21/76832;
(Continued)

(56) References Cited

U.S. PATENT DOCUMENTS

| 9,105,490 B2 | 8/2015 | Wang et al. |
| 9,236,267 B2 | 1/2016 | De et al. |

(Continued)

*Primary Examiner* — Karen Kusumakar
(74) *Attorney, Agent, or Firm* — Sterne, Kessler, Goldstein & Fox P.L.L.C.

(57) ABSTRACT

A method for improving reliability of interconnect structures for semiconductor devices is disclosed. The method includes forming a contact structure on a transistor and forming a metallization layer on the contact structure. The forming the metallization layer includes depositing an inter-metal dielectric (IMD) layer on the transistor, forming an opening within the IMD layer to expose a top surface of the contact structure, depositing a metallic layer to fill the opening, forming an electron barrier layer within the IMD layer, and forming a capping layer within the metallic layer. The electron barrier layer has a hole carrier concentration higher than a hole carrier concentration of a portion of the IMD layer underlying the electron barrier layer. The capping layer has a hole carrier concentration higher than a hole carrier concentration of a portion of the metallic layer underlying the capping layer.

20 Claims, 14 Drawing Sheets

Related U.S. Application Data

No. 16/941,040, filed on Jul. 28, 2020, now Pat. No. 11,264,273.

(60) Provisional application No. 62/967,267, filed on Jan. 29, 2020.

(52) U.S. Cl.
CPC .... *H01L 21/76849* (2013.01); *H01L 23/5226* (2013.01); *H01L 23/53238* (2013.01); *H01L 23/53295* (2013.01)

(58) Field of Classification Search
CPC ......... H01L 23/53295; H01L 23/53238; H01L 21/76807; H01L 21/76867; H01L 21/76829
See application file for complete search history.

(56) References Cited

U.S. PATENT DOCUMENTS

| | | |
|---|---|---|
| 9,236,300 B2 | 1/2016 | Liaw |
| 9,406,555 B2 * | 8/2016 | Deng ................ H01L 21/76849 |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,576,897 B2 | 2/2017 | Deng |
| 9,831,183 B2 | 11/2017 | Lin et al. |
| 9,859,386 B2 | 1/2018 | Ho et al. |
| 9,899,317 B1 | 2/2018 | Clevenger et al. |
| 10,170,322 B1 * | 1/2019 | Cheng ............... H01L 21/76826 |
| 10,699,945 B2 | 6/2020 | Peethala et al. |
| 11,133,216 B2 | 9/2021 | Chen et al. |
| 2010/0155893 A1 | 6/2010 | Chen et al. |
| 2012/0104615 A1 * | 5/2012 | Louis .................. H01L 23/5228 |
| | | 257/E23.141 |
| 2017/0365550 A1 | 12/2017 | Clevenger et al. |
| 2020/0083167 A1 * | 3/2020 | LaRoche ............... H01L 29/475 |
| 2020/0335345 A1 | 10/2020 | Patlolla et al. |
| 2020/0373241 A1 * | 11/2020 | Gerousis ............ H01L 23/5226 |
| 2021/0091303 A1 * | 3/2021 | Patlolla .................. H10N 50/85 |
| 2021/0233805 A1 | 7/2021 | Chen et al. |
| 2022/0102621 A1 | 3/2022 | Wang et al. |
| 2022/0181203 A1 | 6/2022 | Chen et al. |
| 2023/0317467 A1 | 10/2023 | Lu |

* cited by examiner

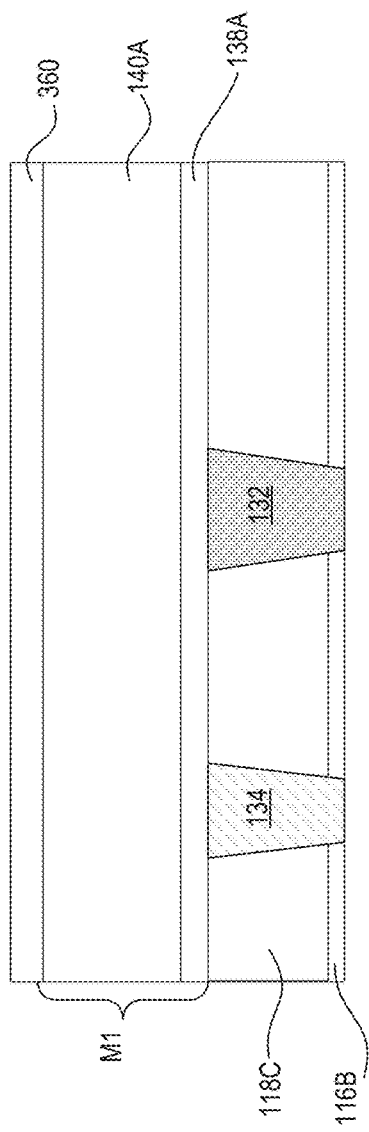
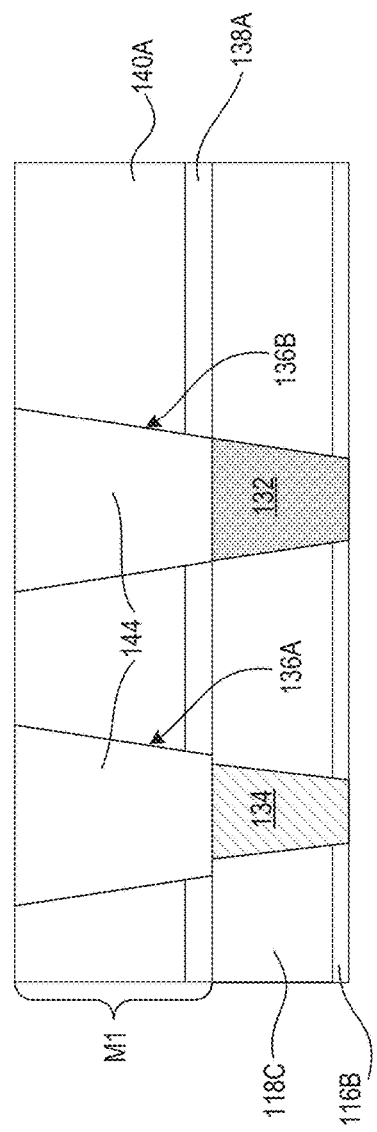

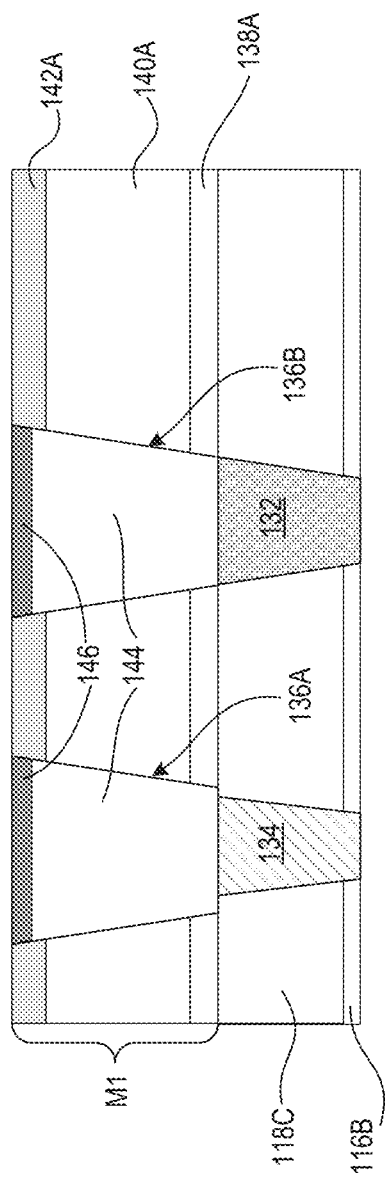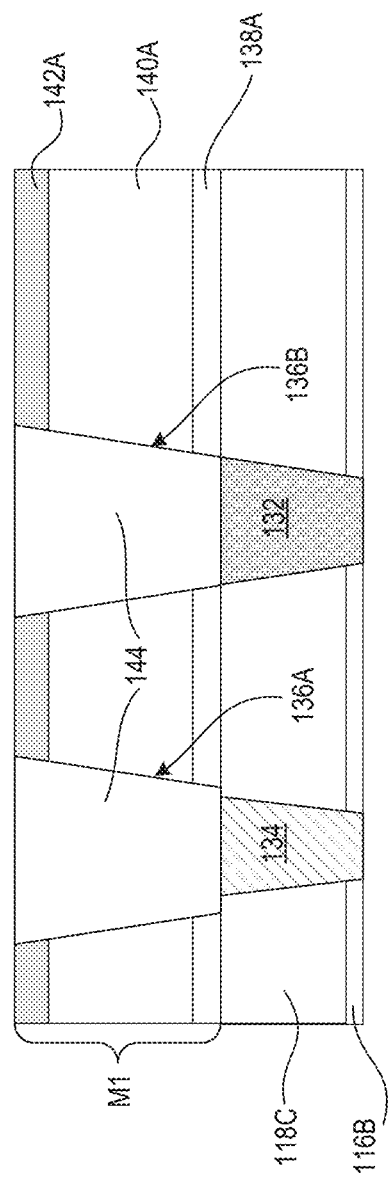

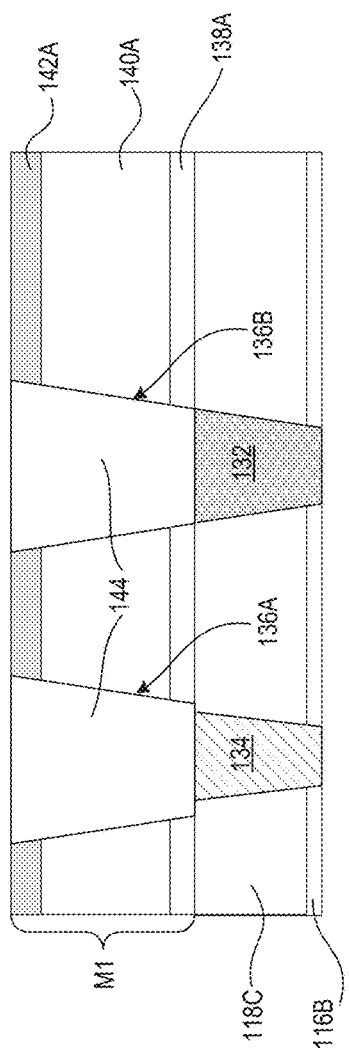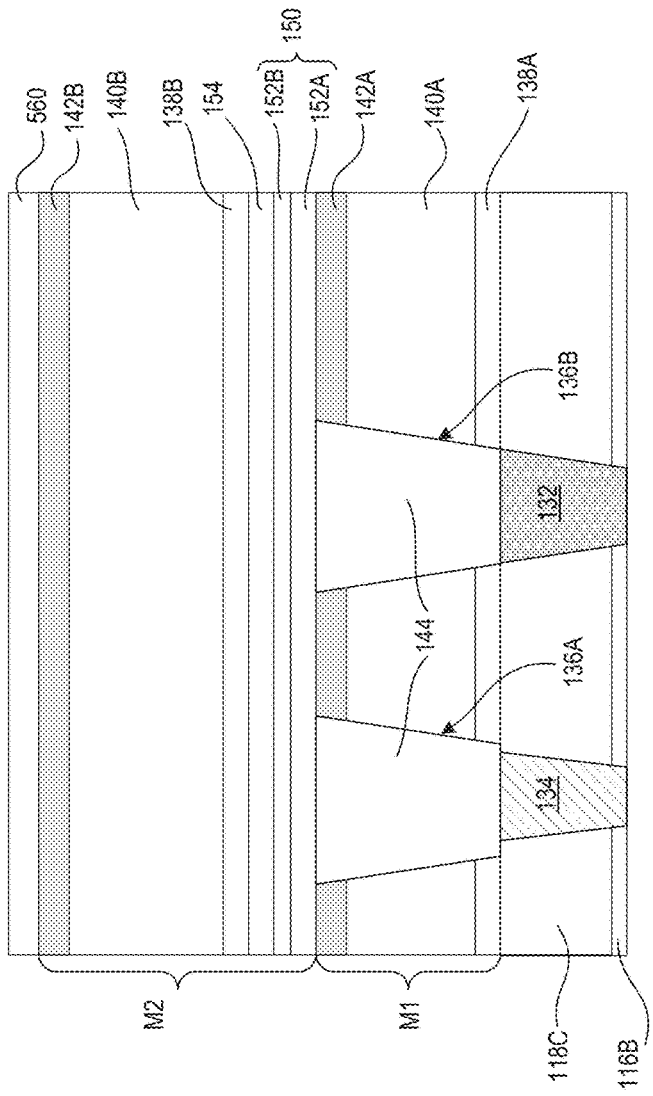

ELECTRON MIGRATION CONTROL IN INTERCONNECT STRUCTURES

CROSS-REFERENCE TO RELATED APPLICATIONS

This application is a continuation of U.S. patent application Ser. No. 17/682,823, titled "Electron Migration Control in Interconnect Structures," filed Feb. 28, 2022, which is a continuation of U.S. patent application Ser. No. 16/941,040, titled "Electron Migration Control in Interconnect Structures," filed Jul. 28, 2020, which claims the benefit of U.S. Provisional Patent Application No. 62/967,267, titled "Interconnect Structures for Semiconductor Devices," filed Jan. 29, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs) and interconnect structures for the semiconductor devices. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-3H illustrate cross-sectional views of an interconnect structure with an electron barrier layer for a semiconductor device at various stages of its fabrication process, in accordance with some embodiments.

FIGS. 5A-5E illustrate cross-sectional views of an interconnect structure with an electron barrier layer for a semiconductor device at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
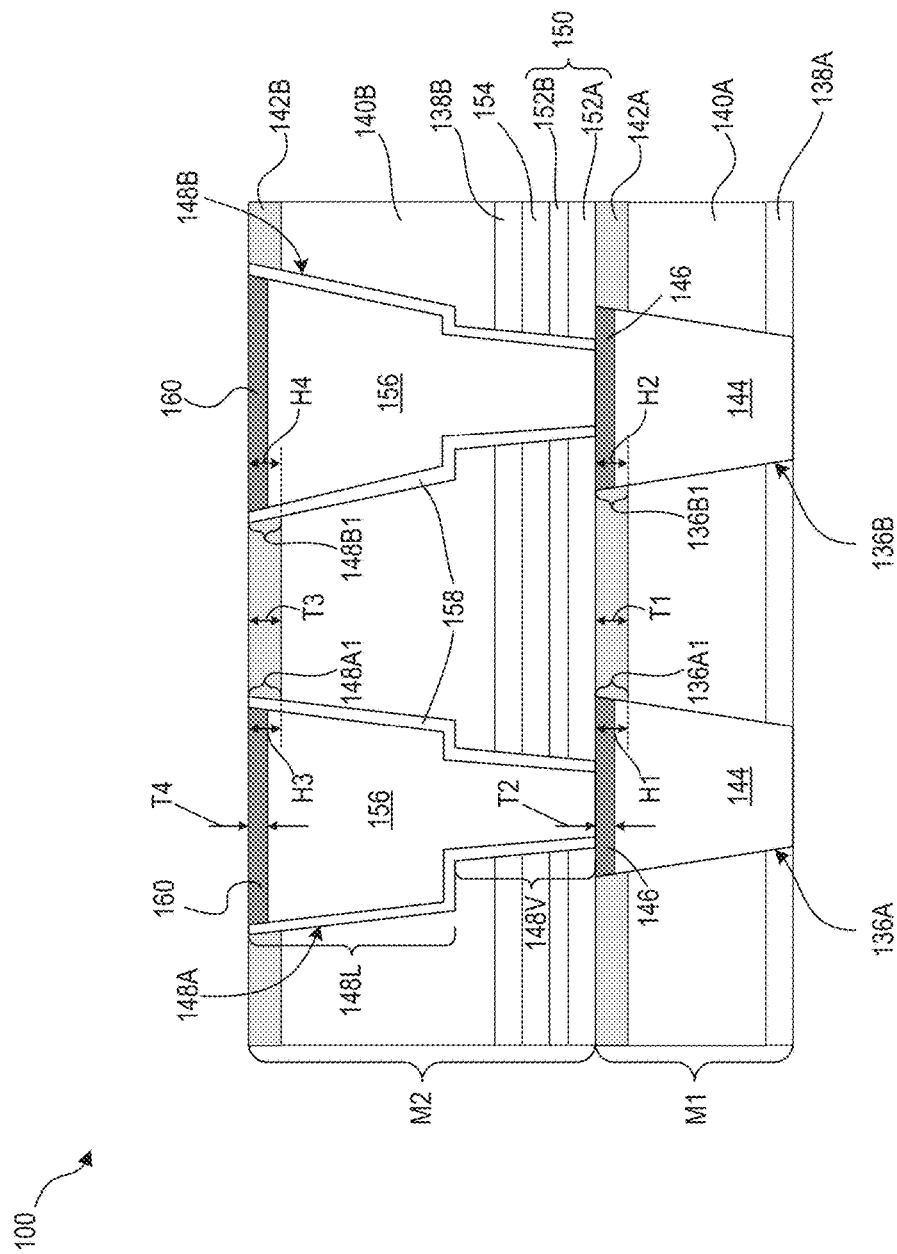
FIG. 1A illustrates a cross-sectional view of an interconnect structure with an electron barrier layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

As used herein, the term "nitridation rate" defines the rate at which a material is converted into a nitride material.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for improving reliability of interconnect structures for semiconductor devices in integrated circuits. The reliability of interconnect structures have been negatively impacted by the scaling down of interconnect structures with the scaling down of semiconductor devices. The scaling down of interconnect structures have resulted in smaller electrical isolation regions (e.g., dielectric regions) between adjacent conductive structures (e.g., metal lines and/or metal vias) of the interconnect structures. Such smaller electrical isolation regions may not prevent electron migration between the adjacent conductive structures during the operation of the semiconductor devices. The electron migration can result in current leakage in the interconnect structures, which can lead to degradation of the semiconductor device performance.

In the example methods, portions of the electrical isolation regions between the adjacent conductive structures of the interconnect structures can be plasma treated to create an electron barrier layer with hole carrier induced electron trap sites. The electron trap sites can trap electrons migrating between the adjacent conductive structures during the operation of the semiconductor devices. The plasma treatment can include a plasma process with a high density and low bombardment energy plasma (e.g., between about 25 eV and about 100 eV) generated using a high plasma source power (e.g., between about 400 W and about 2000 W) and a low bias power (e.g., between about 600 W and 3000 W). The low bombardment energy plasma can provide better thickness control of the electron barrier layer compared to a high bombardment energy plasma (e.g., energy greater than 100 eV). Also, the low bombardment energy plasma can treat the electrical isolation regions without degrading the surface quality of the electrical isolation regions. In some embodiments, each of the adjacent conductive structures can have a nitride capping layer that can trap the migrating electrons during the operation of the semiconductor devices. The use of the electron barrier layers and/or the nitride capping layers can improve the reliability of the interconnect structures by about 20 to about 30 times compared to the reliability of interconnect structures without the electron barrier layers and/or the nitride capping layers.

An interconnect structure 100 with two metallization layers M1-M2 is described with reference to FIG. 1A, according to some embodiments. FIG. 1A illustrates a cross-sectional view of interconnect structure 100, according to some embodiments. Though two metallization layers M1-M2 are discussed with reference to FIG. 1A, interconnect structure 100 can have any number of metallization layers. In some embodiments, interconnect structure 100 can be disposed on passive devices (not shown) and on active devices, such as planar semiconductor devices (e.g., MOSFETs; not shown) and non-planar semiconductor devices (e.g., finFETs 102 described below with reference to FIGS. 1B-1C) of integrated circuits. Interconnect structure 100 can be configured to interconnect these active and passive devices through contact structures and conductive structures (e.g., metal lines and/or metal vias).

In some embodiments, metallization layer M1 can include conductive structures 136A-136B disposed within a stack of layers that includes (i) an etch stop layer (ESL) 138A, (ii) an inter-metal dielectric (IMD) layer 140A disposed on ESL 138A, and (iii) an electron barrier layer 142A disposed on IMD layer 140A. Though two conductive structures 136A-136B in metallization layer M1 are discussed with reference to FIG. 1A, interconnect structure 100 can have any number of conductive structures in metallization layer M1.

ESL 138A can include a dielectric material, such as aluminum oxide ($Al_xO_y$), nitrogen doped silicon carbide (SiCN), and oxygen doped silicon carbide (SiCO). IMD layer 140A can provide electrical isolation between conductive structures 136A-136B and can include silicon oxide ($SiO_2$) or a low-k dielectric material, such as organosilicate glass (also referred to as a "SiOCH film" because it includes silicon, oxygen, carbon, and hydrogen) and silicon oxycarbide (SiOC).

Electron barrier layer 142A includes electron trap sites that prevent or substantially reduce electron migration between conductive structures 136A-136B. The electron trap sites can capture electrons before they migrate from one of conductive structures 136A-136B to the other. In some embodiments, electron barrier layer 142A can include a material (e.g., silicon oxynitride (SiON) or any suitable oxynitride) that provides hole-induced electron trap sites. The holes (i.e., positive charge carriers) in the hole-induced electron trap sites can form electron-hole pairs with the migrating electrons, and as a result prevent the migrating electrons from reaching one of conductive structures 136A-136B. In some embodiments, the material of electron barrier layer 142A can be a nitride of the material of IMD layer 140A and can be formed by performing a nitridation process on IMD layer 140A.

Electrons can migrate between regions (e.g., regions 136A1-136B1) of conductive structures 136A-136B that are separated from each other by a horizontal distance or an average horizontal distance (e.g., along an X-axis) less than an electron migration distance. The electron migration distance is the maximum distance that the electrons migrating out of conductive structures can travel before losing their momentum. Thus, electron barrier layer 142A may be formed between regions 136A1-136B1 and not between regions of conductive structures 136A-136B that are separated from each other by a horizontal distance or an average horizontal distance (e.g., along an X-axis) greater than the electron migration distance. As a result, electron barrier layer 142A with a thickness T1 substantially equal to (shown in FIG. 1A) or greater (not shown) than vertical dimensions H1-H2 of regions 136A1-136B1 can prevent or substantially reduce electron migration between regions 136A1-136B1. In some embodiments, thickness T1 can range from about 2 nm to about 5 nm.

Conductive structures 136A-136B can be metal lines or metal vias of interconnect structure 100. Each of conductive structures 136A-136B can include a metallic layer 144 and a capping layer 146. Metallic layers 144 can include copper (Cu), a copper alloy (e.g., copper-ruthenium (Cu—Ru), copper-aluminum (Cu—Al), or copper-manganese (CuMn)), or any other suitable metal or alloy. Capping layers 146 can include a conductive material, such as a nitride of the material of metallic layers 144 (e.g., copper nitride (CuN)) and can be formed by performing a nitridation process on metallic layers 144. The nitridation process on metallic layers 144 and on IMD layer 140A can be performed at the same time, according to some embodiments. In some embodiments, capping layers 146 may not be included in conductive structures 136A-136B and metallic layers 144 can be protected by a masking layer during the nitridation process on IMD layer 140A to prevent the formation of capping layers 146.

In some embodiments, thickness T2 of capping layers 146 can be smaller than thickness T1 of electron barrier layer 142A due to a lower nitridation rate of the metallic material of metallic layers 144 compared to that of the material of IMD layer 140A. In some embodiments, thickness T2 of capping layers 146 can range from about 1 nm to about 3 nm. Capping layers 146 with thickness T2 below this range may not be effective in trapping electrons and thickness T2 above this range may increase the contact resistance between conductive structures 136A and 148A and between conductive structures 136B and 148B. Similar to electron barrier layer 142A, capping layers 146 can have electron trap sites that prevent or substantially reduce electron migration between conductive structures 136A-136B.

In some embodiments, metallization layer M2 can be disposed on metallization layer M1. Metallization layer M2 can include conductive structures 148A-148B disposed within a stack of layers that includes (i) a diffusion barrier layer 150 disposed on electron barrier layer 142 and conductive structures 136A-136B, (ii) ESLs 138B and 154 disposed on diffusion barrier layer 150, (iii) an IMD layer 140B disposed on ESL 138B, and (iv) an electron barrier layer 142B disposed on IMD layer 140B. Though two conductive structures 148A-148B in metallization layer M2 are discussed with reference to FIG. 1A, interconnect structure 100 can have any number of conductive structures in metallization layer M2.

Diffusion barrier layer 150 can include a nitride layer 152A disposed on electron barrier layer 142 and conductive structures 136A-136B and an oxide layer 152B disposed on nitride layer 152A. Nitride and oxide layers 152A-152B can include any suitable nitride and oxide material configured to prevent diffusion of metal molecules from conductive structures 136A-136B to IMD layer 140B and from conductive structures 148A-148B to IMD layer 140A. The materials of ESLs 138B and 154 may not have atomic density high enough to block the metal diffusion. The materials of nitride and oxide layers 152A-152B with atomic densities higher than that of the materials of ESLs 138B and 154 can be more effective in blocking the metal diffusion between metallization layers M1-M2.

In some embodiments, nitride layer 152A can include a metallic nitride, such as gallium nitride (GaN), titanium nitride (TiN), tantalum nitride (TaN), aluminum nitride (AlN), and any combinations thereof. In some embodiments, oxide layer 152B can include a metallic oxide of the metal of nitride layer 152A. For example, if nitride layer 152A includes AlN, TiN, TaN, or GaN, then oxide layer 152B can include aluminum oxide ($Al_2O_3$), titanium oxide ($TiO_2$), tantalum oxide ($Ta_2O_5$), or gallium oxide ($Ga_2O_3$), respectively. In some embodiments, both nitride and oxide layers 152A-152B can be formed by a CVD process. In some embodiments, oxide layer 152B can be formed by oxidizing a portion of nitride layer 152A.

ESLs 138B and 154 can include dielectric materials, such as $Al_xO_y$, SiCN, and SiCO. IMD layer 140B can provide electrical isolation between conductive structures 148A-148B and can include silicon oxide ($SiO_2$) or a low-k dielectric material, such as organosilicate glass and silicon oxycarbide (SiOC). IMD layers 140A-140B can have materials similar to or different from each other.

Similar to electron barrier layer 142A, electron barrier layer 142B includes electron trap sites that prevent or substantially reduce electron migration between conductive structures 148A-148B. Electron barrier layers 142A-142B can have materials (e.g., silicon oxynitride (SiON) or any suitable oxynitride) similar to or different from each other that provide hole-induced electron trap sites. In some embodiments, the material of electron barrier layer 142B can be a nitride of the material of IMD layer 140B and can be formed by performing a nitridation process on IMD layer 140B.

Electron barrier layer 142B may be formed between regions 148A1-148B1 of conductive structures 148A-148B that are separated from each other by a horizontal distance or an average horizontal distance (e.g., along an X-axis) less than the electron migration distance. As a result, electron barrier layer 142B with a thickness T3 substantially equal to (shown in FIG. 1A) or greater (not shown) than vertical dimensions H3-H4 of regions 148A1-148B1 can prevent or substantially reduce electron migration between regions 148A1-148B1. In some embodiments, thickness T3 can range from about 2 nm to about 5 nm.

Each of conductive structures 148A-148B can be a dual-damascene conductive structure with a metal line 148L and a metal via 148V. In some embodiments, each of conductive structures 148A-148B can include a metallic layer 156, a metallic liner 158, and a capping layer 160. The discussion of metallic layers 144 and capping layers 146 applies to metallic layers 156 and capping layers 160, respectively, unless mentioned otherwise. Metallic liners 158 can include TiN or TaN to prevent diffusion of atoms from metallic layers 156 into IMD layer 140B. Capping layers 160 can include a conductive material, such as a nitride of the material of metallic layers 156 (e.g., copper nitride (CuN)) and can be formed by performing a nitridation process on metallic layers 156. In some embodiments, capping layers 160 may not be formed in conductive structures. In some embodiments, thickness T4 of capping layers 160 can be smaller than thickness T3 of electron barrier layer 142B due to a lower nitridation rate of the metallic material of metallic layers 156 compared to that of the material of IMD layer 140B. In some embodiments, thickness T2 of capping layers 146 can range from about 1 nm to about 3 nm. Capping layers 160 can have electron trap sites that prevent or substantially reduce electron migration between conductive structures 148A-148B. The cross-sectional shape of interconnect structure 100 and its elements (e.g., conductive structures 136A-136B and 148A-148B) are illustrative and are not intended to be limiting.

Figure 1B:
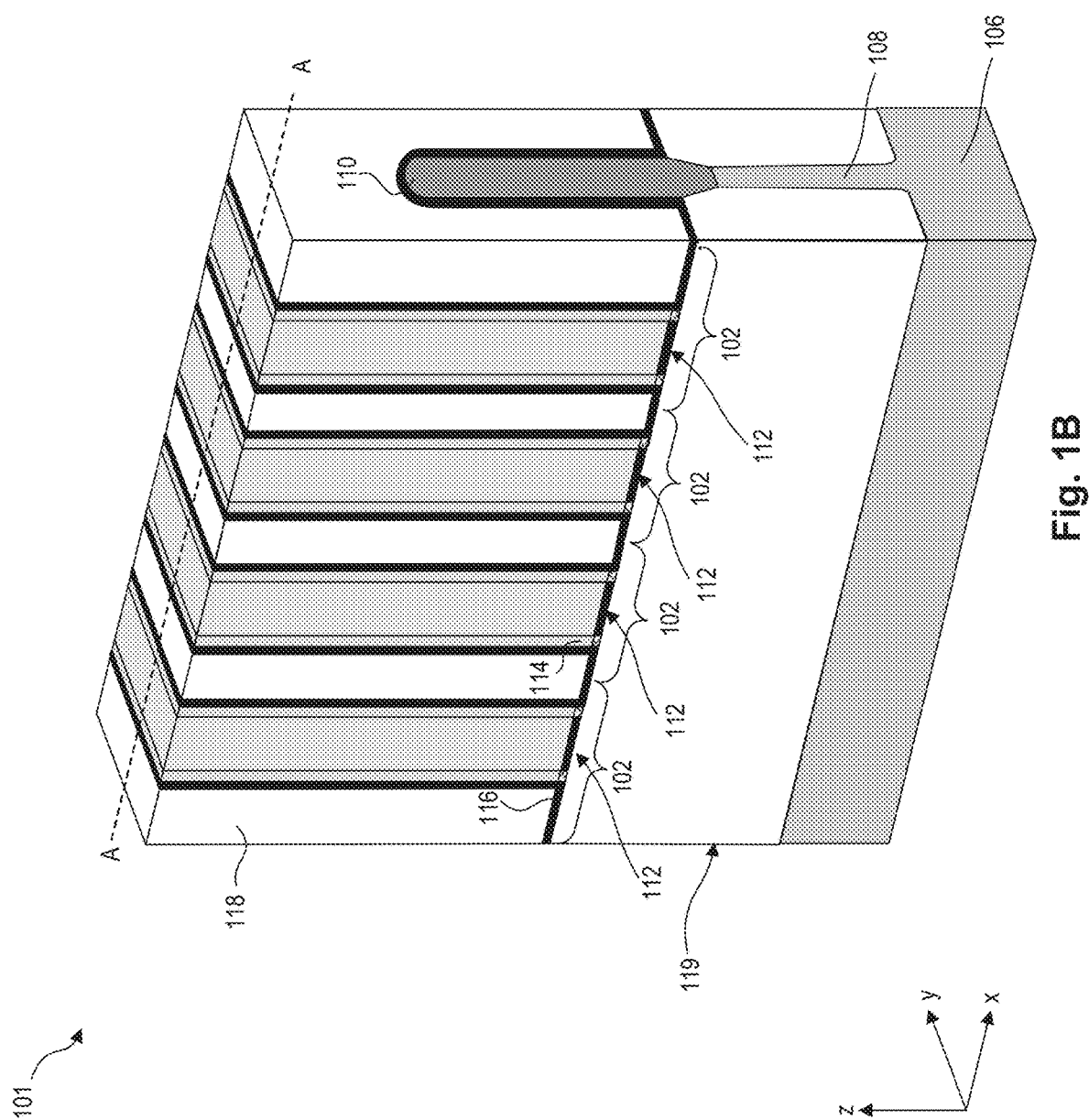
FIGS. 1B-1C illustrate an isometric view and a cross-sectional view of a semiconductor device, in accordance with some embodiments
Figure 1C:
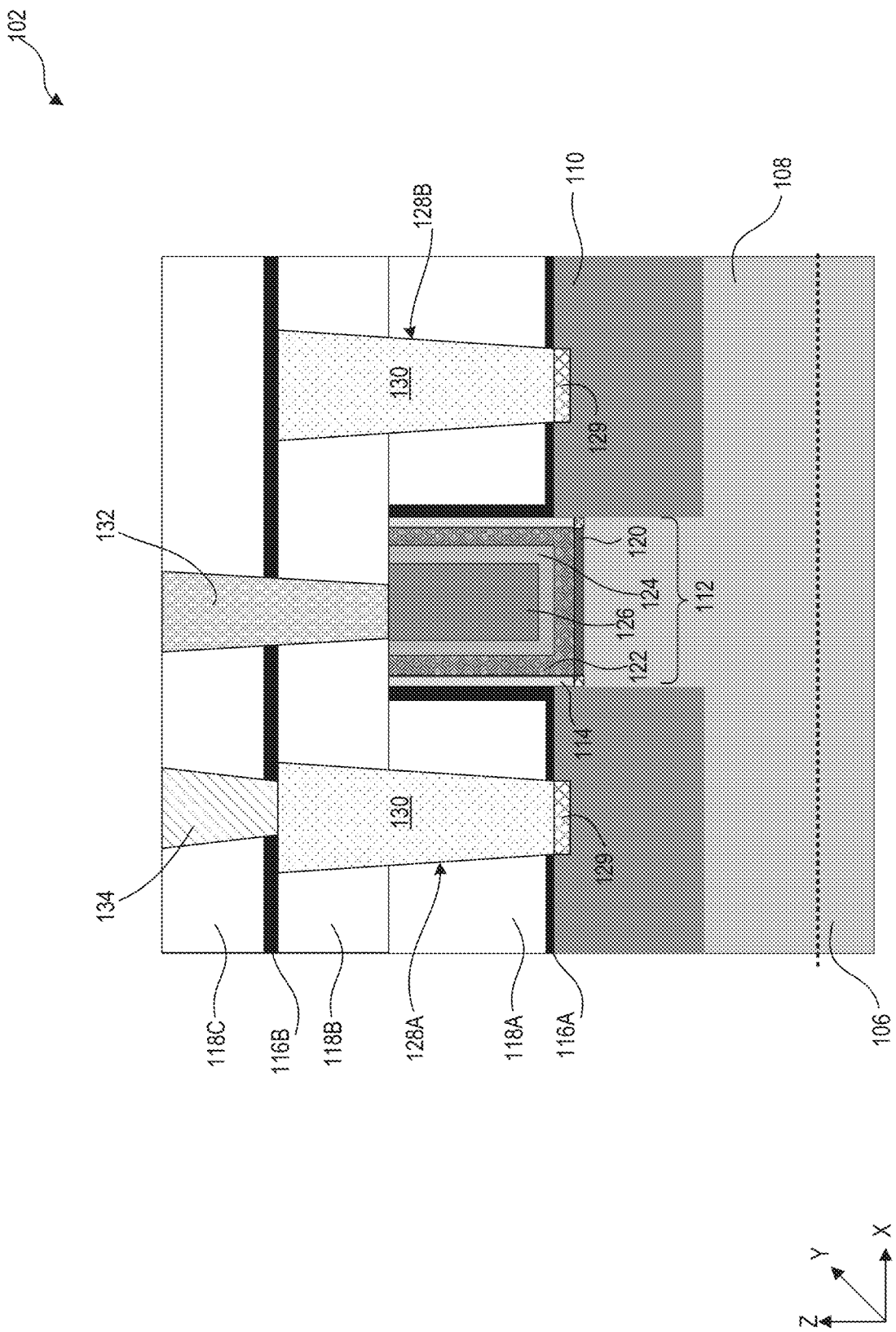

Referring to FIGS. 1A-1C, in some embodiments, interconnect structure 100 can be disposed on one of finFETs 102 of semiconductor device 101. FIG. 1B illustrates an isometric view of semiconductor device 101 and FIG. 1C illustrates a cross-sectional view of one of finFETs 102 along line A-A of FIG. 1B, according to some embodiments.

FinFET 102 can be formed on a substrate 106 including a semiconductor material. FinFET 102 can include a fin structure 108 extending along an X-axis, a gate structure 112 extending along a Y-axis, epitaxial fin regions 110, gate spacers 114, ESLs 116A-116B, interlayer dielectric (ILD) layers 118A-118C, and shallow trench isolation (STI) region 119. Fin structure 108 can include a material similar to substrate 106 and can be formed from patterning and etching of substrate 106. Epitaxial fin regions 110 can have semiconductor materials and can be source/drain (S/D) regions 110 of finFET 102. In some embodiments, n-type epitaxial fin regions 110 can include SiAs, SiC, or SiCP, and p-type epitaxial fin regions 110 can include SiGe, SiGeB, GeB, SiGeSnB, or a III-V semiconductor compound.

Gate structure 112 can be multi-layered structure and can be wrapped around fin structure 108. Referring to FIG. 1C, gate structure 112 can include an interfacial oxide (IO) layer 120, a high-k gate dielectric layer 122, a work function metal (WFM) layer 124, and a gate metal fill layer 126. IO layer 120 can include silicon oxide ($SiO_2$) silicon germanium oxide ($SiGeO_x$) or germanium oxide ($GeO_x$). High-k gate dielectric layer 122 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layer 124 can include titanium aluminum (TiAl), titanium aluminum carbide (TiAlC), tantalum aluminum (TaAl), tantalum aluminum carbide (TaAlC), or a combination thereof. Gate metal fill layer 126 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. Gate spacers 114 can form sidewalls of gate structure 112 and can include insulating material, such as silicon oxide, silicon nitride, silicon oxynitride, a low-k material, and a combination thereof. ESLs 116A-116B can include an insulating material, such as silicon oxide and silicon germanium oxide. ILD layers 118A-118C can include a dielectric material. STI region 119 can include an insulating material.

Referring to FIG. 1C, finFET 102 can further include S/D contact structures 128A-128B disposed on S/D regions 110, a metal via 134 disposed on S/D contact structure 128A, and gate contact structure 132 disposed on gate structure 112. These elements of finFET 102 are not shown in FIG. 1B for the sake of simplicity. In some embodiments, interconnect structure 100 can be disposed on finFET 102 such that conductive structures 136A and 136B are disposed on and electrically connected to metal via 134 and gate contact structure 132, respectively. In some embodiments, though not shown in FIG. 1C for the sake of simplicity, a metal via similar to metal via 134 can be formed on S/D contact structure 128B and can be electrically connected to a conductive structure in metallization layer M1 of interconnect structure 100.

S/D contact structure 128 can be configured to electrically connect S/D region 110 to other elements of finFET 102 and/or of the integrated circuit (not shown) through metal via 134 and interconnect structure 100. Similarly, gate contact structure 132 can be configured to electrically connect gate structure 112 to other elements of finFET 102 and/or of the integrated circuit through interconnect structure 100. In some embodiments, each of S/D contact structures 128A-128B can include a silicide layer 129 and a S/D contact plug 130. S/D contact plugs 130 and gate contact structure 132 can include conductive materials, such as ruthenium (Ru), iridium (Ir), nickel (Ni), Osmium (Os), rhodium (Rh), Al, molybdenum (Mo), tungsten (W), cobalt (Co), and Cu. The cross-sectional shape of finFET 102 and its elements (e.g., fin structure 108, gate structure 112, epitaxial fin region 110, gate spacers 114, STI region 119, S/D contact structures 128A-128B, gate contact structure 132, and/or metal via 134) are illustrative and are not intended to be limiting.

Figure 2:
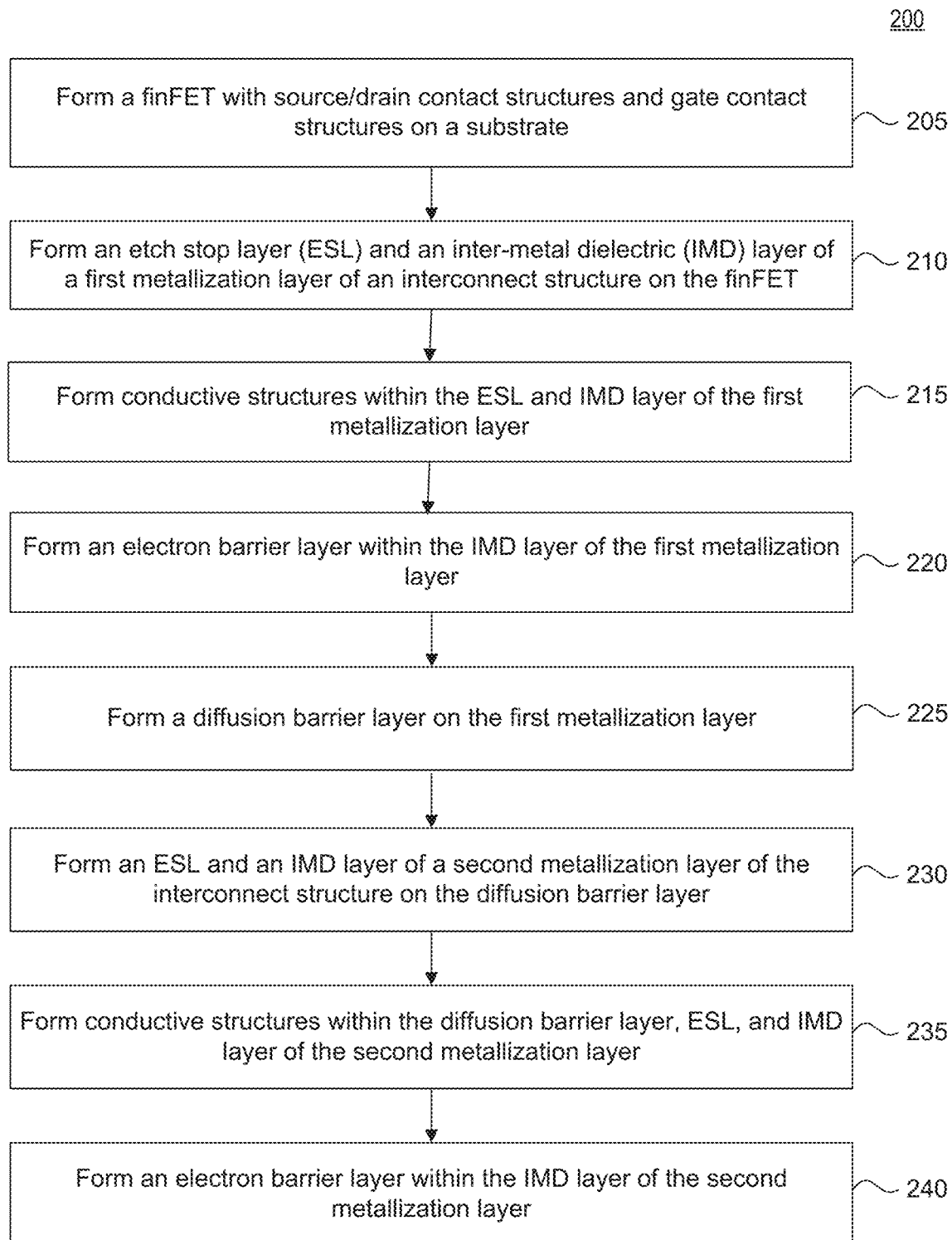
FIG. 2 is a flow diagram of a method for fabricating an interconnect structure with an electron barrier layer for a semiconductor device, in accordance with some embodiments.

FIG. 2 is a flow diagram of an example method 200 for fabricating interconnect structure 100 on finFET 102, according to some embodiments. For illustrative purposes, the operations illustrated in FIG. 2 will be described with reference to the example process for fabricating interconnect structure 100 on finFET 102 as illustrated in FIGS. 3A-3H. FIGS. 3A-3H are cross-sectional views of interconnect structure 100 on finFET 102 at various stages of their fabrication, according to some embodiments. Operations can be performed in a different order or not performed depending on specific applications. It should be noted that method 200 may not produce a complete interconnect structure 100 and finFET 102. Accordingly, it is understood that additional processes can be provided before, during, and after method 200, and that some other processes may only be briefly described herein. Elements in FIGS. 3A-3H with the same annotations as elements in FIGS. 1A-1C are described above.

Figure 3A:
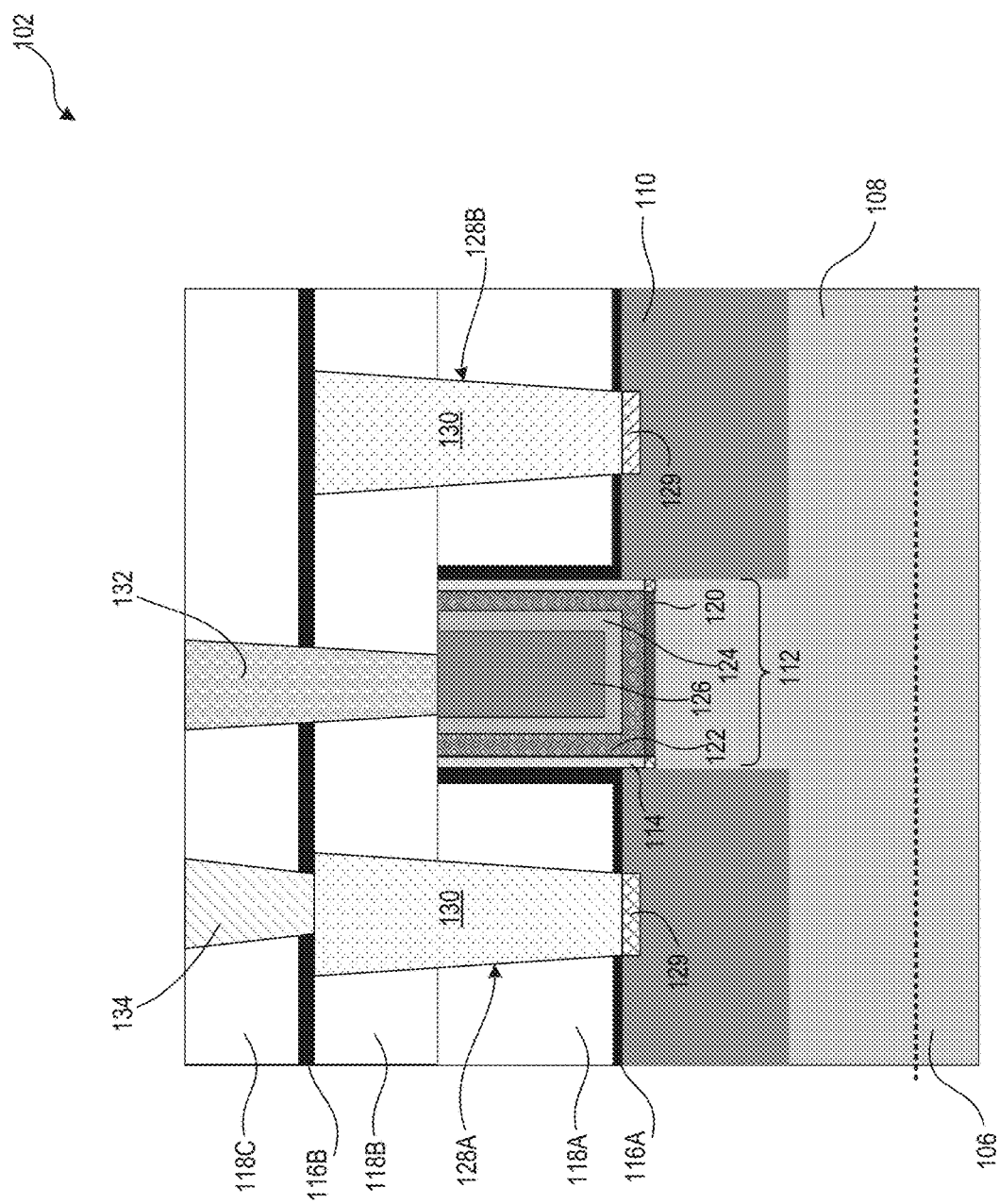

In operation 205, a finFET with S/D contact structures and a gate contact structure are formed on a substrate. For example, as shown in FIG. 3A, finFET 102 can be formed on substrate 106 with S/D contact structures 128A-128B and gate contact structure 132. The S/D contact structures 128A-128B can be formed after the deposition of ILD layer 118B on ILD layer 118A and gate structure 112. The formation of S/D contact structure 128A-128B can include sequential operations of: (i) forming contact openings (not shown) within ILD layers 118A-118B, (ii) forming silicide layers 129 on exposed regions of epitaxial regions 110 within the contact openings, and (iii) depositing S/D contact plugs 130 within the contact openings.

The formation of S/D contact structures 128A-128B can be followed by the sequential operations of (i) depositing ESL 116B on ILD layer 118B and S/D contact plugs 130, (ii) depositing ILD layer 118C on ESL 116B, (iii) forming gate contact structure 132 within ESL 116B and ILD layers 118B-118C, and (iv) forming metal via 134 within ESL 116B and ILD 118C.

Referring to FIG. 2, in operation 210, an ESL and an IMD layer of a first metallization layer of an interconnect structure are formed on the finFET. For example, as shown in FIG. 3B, ESL 138A can be formed on the structure of FIG. 3A and IMD layer 140A can be formed on ESL 138A. For the sake of simplicity, only a portion of finFET 102 underlying ESL 138A is shown in FIG. 3B. ESL 138A can be formed by any suitable dielectric deposition method, such as chemical vapor deposition (CVD). IMD layer 140A can be formed by a CVD process, a plasma enhanced CVD process, a flowable CVD process, or a spin-on coating process. Following the deposition of IMD layer 140A, a hard mask layer 360 can be deposited on IMD layer 140A to protect IMD layer 140A during subsequent formation of conductive structure 136A-136B.

Referring to FIG. 2, in operation 215, conductive structures are formed within the ESL and IMD layer of the first metallization layer. For example, as shown in FIG. 3C, conductive structures 136A-136B can be formed within ESL 138A and IMD layer 140A, and on metal via 134 and gate contact structure 132. The formation of conductive structures 136A-136B can include sequential operations of: (i) forming openings (not shown) within hard mask layer 360, IMD layer 140A, and ESL 138A to expose top surfaces of metal via 134 and gate contact structure 132, (ii) depositing a material of metallic layers 144 to fill the openings, and (iii) chemical mechanical polishing (CMP) hard mask layer 360 and the deposited material extending out of the openings to form the structure of FIG. 3C with top surfaces of metallic layers 144 and IMD layer 140A substantially coplanar with each other. The openings can be formed using a wet or dry etch process and the material of metallic layers 144 can be deposited using a CVD process or a electrochemical plating (ECP) process.

Referring to FIG. 2, in operation 220, an electron barrier layer is formed within the IMD layer of the first metallization layer. For example, as shown in FIG. 3D, electron barrier layer 142A can be formed within IMD layer 140A. The formation of electron barrier layer 142A can include performing a nitridation process on the structure of FIG. 3C to convert a top portion of IMD layer 140A into electron barrier layer 142A. As a result, electron barrier layer 142A can be a nitride of the material of IMD layer 140A. The nitridation process can include a high density and low bombardment energy plasma (e.g., between about 25 eV and about 100 eV) of nitrogen gas, ammonia (NH3) gas, or nitrous oxide gas. The plasma can be generated using a high plasma source power (e.g., between about 400 W and about 2000 W) and a low bias power (e.g., between about 600 W and 3000 W). The nitridation process and the conversion of the top portion of IMD layer 140A into a nitride material can increase the hole carrier concentration in the converted portion of IMD layer 140A, which is electron barrier layer 142A. Thus, the hole carrier concentration in electron barrier layer 142A is greater than that in the unconverted portion of IMD layer 140A. The holes in electron barrier layer 142A generated as a result of the nitridation process can act as the hole-induced electron trap sites discussed above.

In some embodiments, metallic layers 144 can remain exposed during the nitridation process and as a result, top portions of metallic layers 144 are converted into capping layers 146 (shown in FIG. 3D), which include a nitride of the material of metallic layers 144. The nitridation process and the conversion of the top portions of metallic layers 144 into a nitride material can increase the hole carrier concentration in the converted portions of metallic layers 144, which are capping layers 146. Thus, the hole carrier concentration in capping layers 146 is greater than that in the unconverted portions of metallic layers 144. The holes in capping layers 146 generated as a result of the nitridation process can act as the hole-induced electron trap sites discussed above.

Due to the faster nitridation rate of the material of IMD layer 140A compared to that of the material of metallic layers 144, electron barrier layer 142A can be thicker than capping layers 146. In some embodiments, metallic layers 144 can be protected with a masking layer (e.g., a photoresist layer; not shown) during the nitridation process and as a result, the structure of FIG. 3E can be formed without capping layers 146. The masking layer can be formed after the CMP process of operation 215.

Figure 3F:
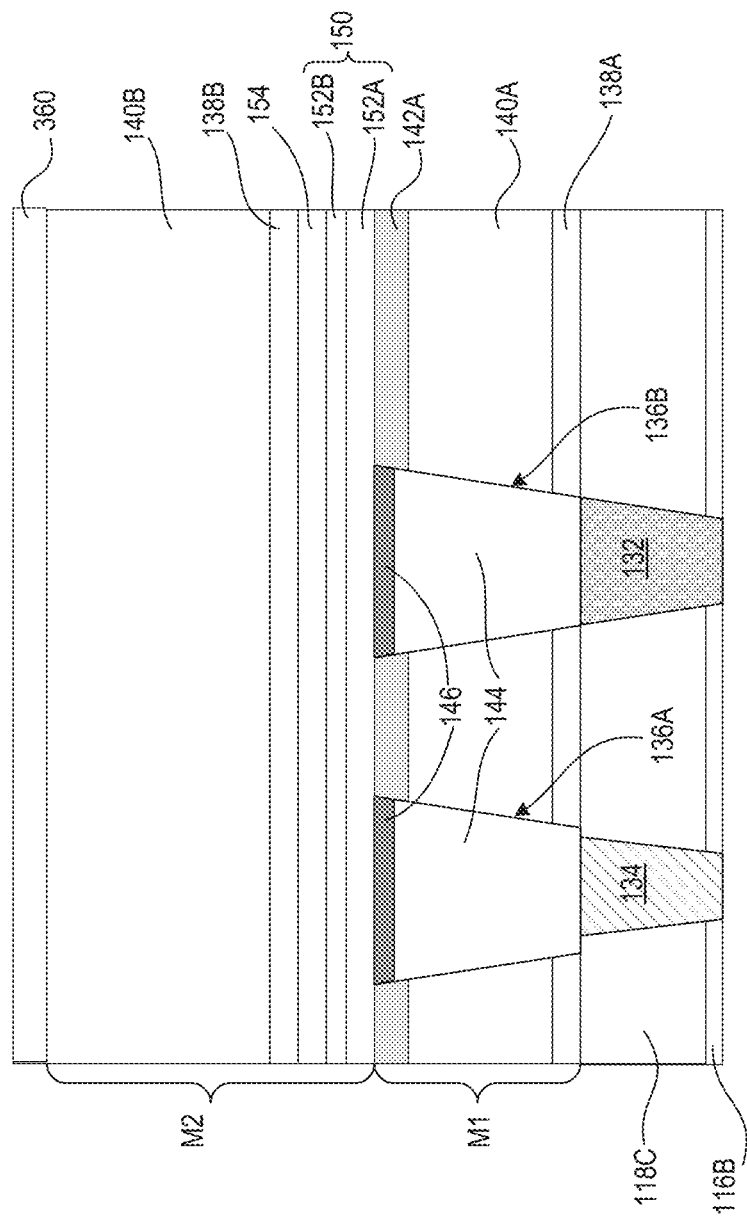

Referring to FIG. 2, in operation 225, a diffusion barrier layer is formed on the first metallization layer. For example, as shown in FIG. 3F, diffusion barrier layer 150 can be formed on metallization layer M1. The formation of diffusion barrier layer 150 can include sequential operations of: (i) depositing nitride layer 152A on the structure of FIG. 3D, and (ii) depositing oxide layer 152B on nitride layer 152A. In some embodiments, nitride layer 152A can include a metallic nitride material formed by a CVD process and oxide layer 152B can be formed by oxidizing a top portion of nitride layer 152A with a thermal, plasma and/or other suitable oxidation process. As a result, oxide layer 152B can be an oxide of the metallic material of nitride layer 152A. In some embodiments, the formation of diffusion barrier layer 150 can be followed by the deposition of ESL 154 on oxide layer 152B.

Referring to FIG. 2, in operation 230, an ESL and an IMD layer of a second metallization layer of the interconnect structure are formed on the diffusion barrier layer. For example, as shown in FIG. 3F, ESL 138B and IMD layer 140B can be formed on diffusion barrier layer 150. The formation of ESL 138B and IMD layer 140B is similar to that of ESL 138A and IMD layer 140A in operation 210. Similar to operation 210, hard mask layer 360 can be formed on IMD layer 140B.

Figure 3G:
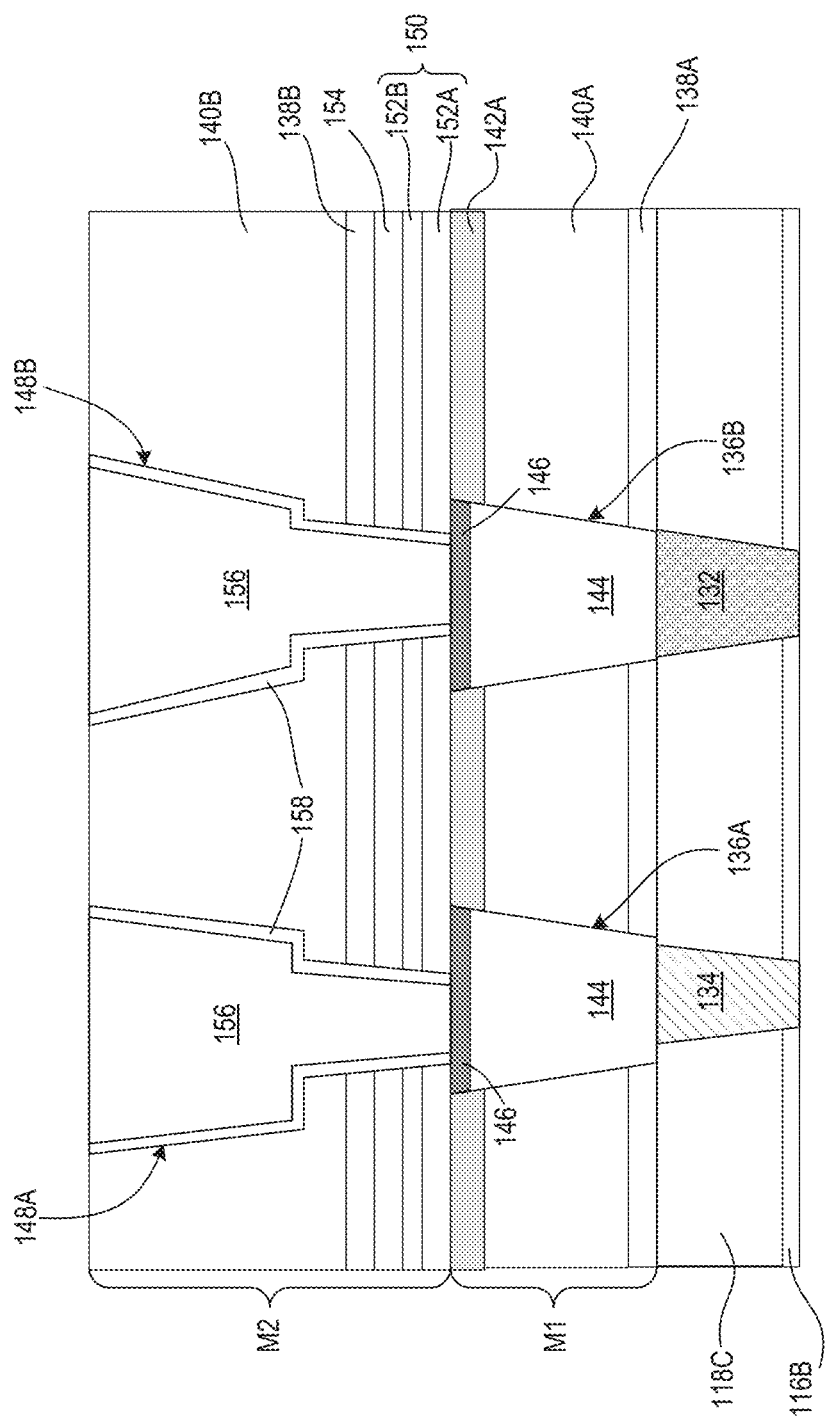

Referring to FIG. 2, in operation 235, conductive structures are formed within the diffusion barrier layer, ESL, and IMD layer of the second metallization layer. For example, as shown in FIG. 3G, conductive structures 148A-148B can be formed within diffusion barrier layer 150, ESL 138B, and IMD layer 140B using a dual damascene process. The formation of conductive structures 148A-148B can include sequential operations of: (i) forming openings (not shown) within hard mask layer 360, ESL 138B, IMD layer 140B, ESL 154, and diffusion barrier layer 150 to expose top surfaces of conductive structures 136A-136B, (ii) depositing metallic liner 158 along sidewalls of the openings, (iii) depositing a material of metallic layers 156 to fill the openings, and (iv) chemical mechanical polishing (CMP) hard mask layer 360 and the metallic liner 158 and the material of metallic layers 156 extending out of the openings to form the structure of FIG. 3G with top surfaces of metallic layers 156, metallic liner 158, and IMD layer 140B substantially coplanar with each other. The openings can be formed using a wet or dry etch process, metallic liner 158 can be deposited using an atomic layer deposition (ALD) process or a CVD process, and the material of metallic layers 158 can be deposited using a CVD process or a electrochemical plating (ECP) process.

Figure 3H:
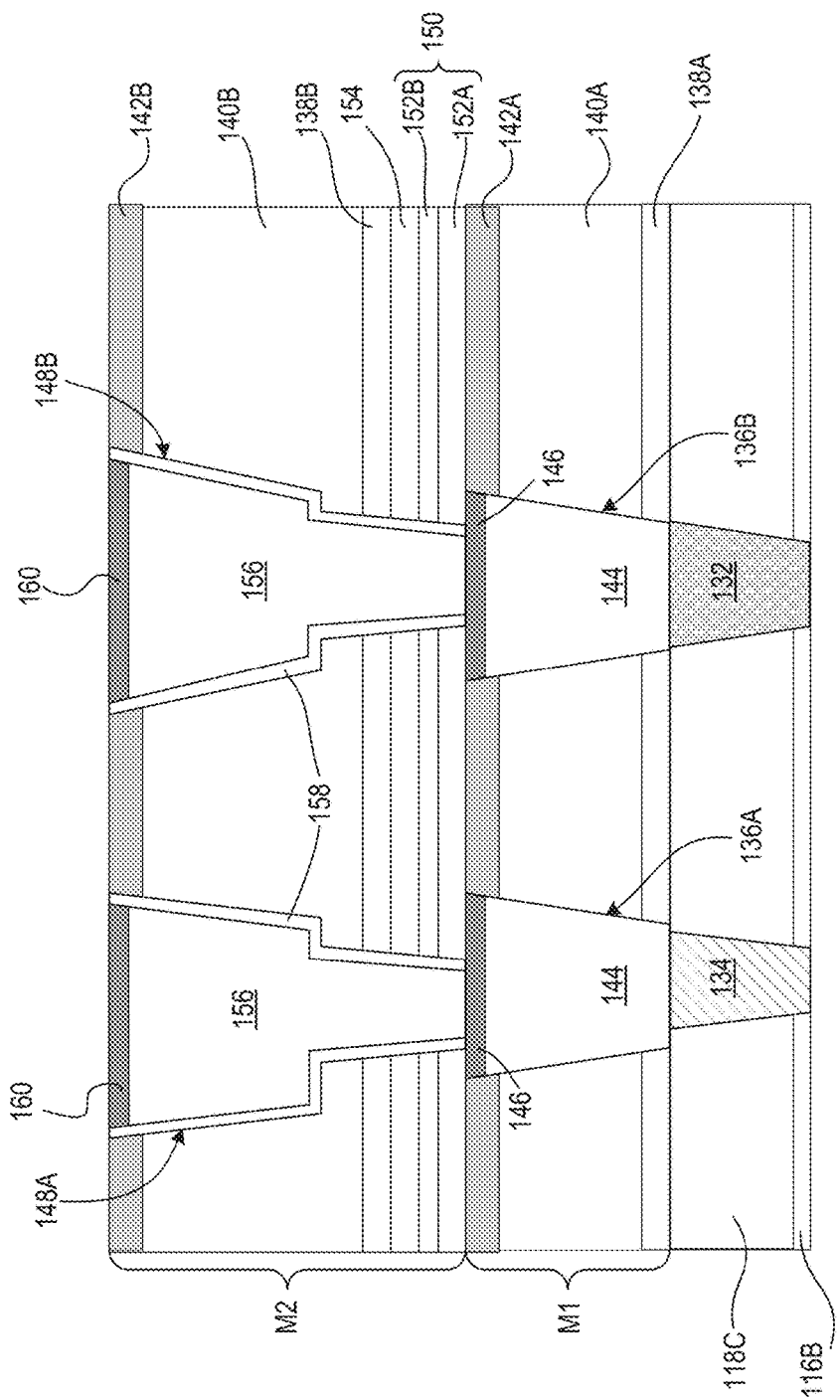

Referring to FIG. 2, in operation 240, an electron barrier layer is formed within the IMD layer of the second metallization layer. For example, as shown in FIG. 3H, electron barrier layer 142B can be formed within IMD layer 140B. The formation of electron barrier layer 142B can include performing a nitridation process on the structure of FIG. 3G to convert a top portion of IMD layer 140B into electron barrier layer 142B. The nitridation process can be similar to that discussed in operation 220. Similar to capping layers 146, capping layers 160 can be formed (shown in FIG. 3H) if conductive structures 148A-148B are exposed during the nitridation process and capping layers 160 are not formed (not shown) if conductive structures 148A-148B are protected by a masking layer during the nitridation process.

Figure 4:
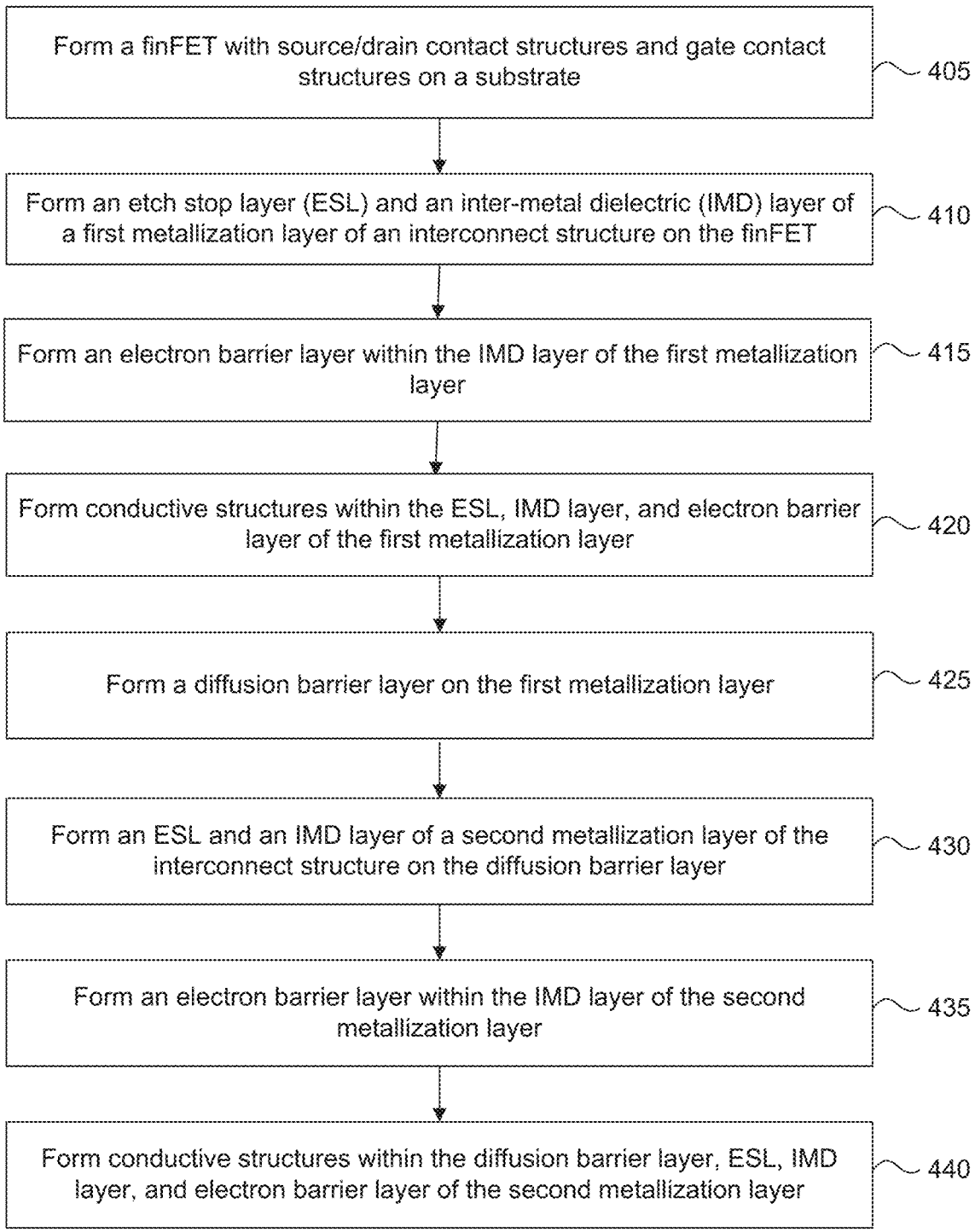
FIG. 4 is a flow diagram of a method for fabricating an interconnect structure with an electron barrier layer for a semiconductor device, in accordance with some embodiments.

FIG. 4 is a flow diagram of an example method 400 for fabricating interconnect structure 100 on finFET 102, according to some embodiments. For illustrative purposes, the operations illustrated in FIG. 4 will be described with reference to the example process for fabricating interconnect structure 100 on finFET 102 as illustrated in FIGS. 5A-5E. FIGS. 5A-5E are cross-sectional views of interconnect structure 100 on finFET 102 at various stages of their fabrication, according to some embodiments. Operations can be performed in a different order or not performed depending on specific applications. It should be noted that method 400 may not produce a complete interconnect structure 100 and finFET 102. Accordingly, it is understood that additional processes can be provided before, during, and after method 400, and that some other processes may only be briefly described herein. Elements in FIGS. 5A-5E with the same annotations as elements in FIGS. 1A-1C are described above.

In operation 405, a finFET with S/D contact structures and a gate contact structure are formed on a substrate. Similar to operation 205 described with reference to FIG. 3A, finFET 102 can be formed on substrate 106 with S/D contact structures 128A-128B and gate contact structures 132.

Referring to FIG. 4, in operation 410, an ESL and an IMD layer of a first metallization layer of an interconnect structure are formed on the finFET. Similar to operation 210 described with reference to FIG. 3B, ESL 138A and IMD layer 140A can be formed on finFET 102.

Figure 5A:
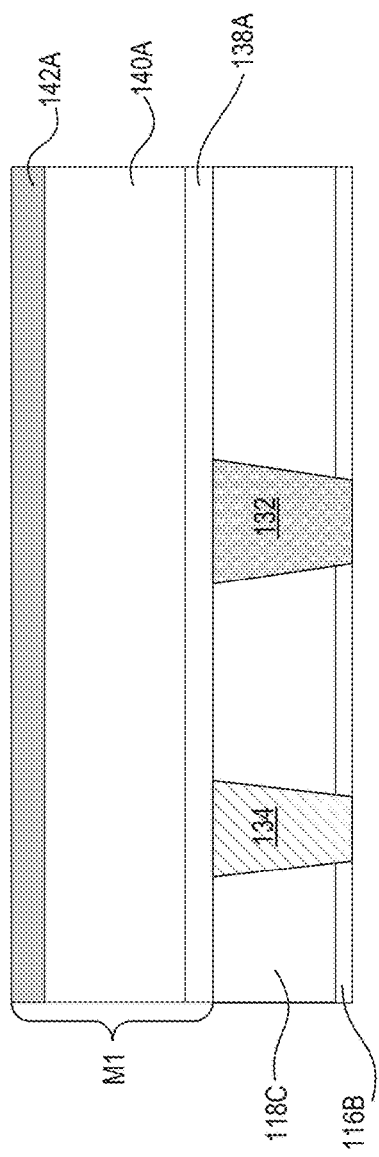
Figure 5B:
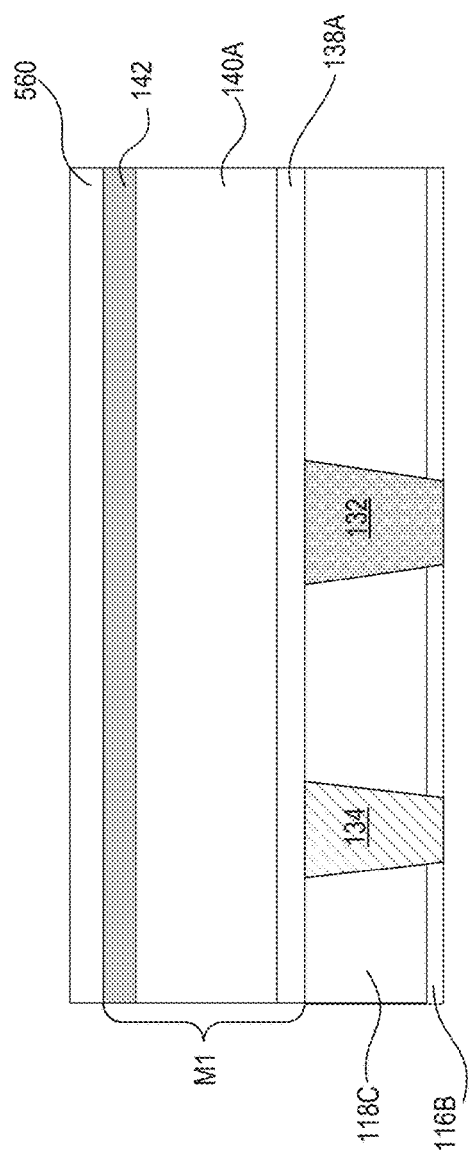

Referring to FIG. 4, in operation 415, an electron barrier layer is formed within the IMD layer of the first metallization layer. For example, as shown in FIG. 5A, electron barrier layer 142A can be formed on IMD layer 140A in an operation similar to operation 220 described with reference to FIG. 3D.

Referring to FIG. 4, in operation 420, conductive structures are formed within the ESL, IMD layer, and electron barrier layer of the first metallization layer. For example, as shown in FIG. 5C, conductive structures 136A-136B can be formed within ESL 138A, IMD layer 140A, and electron barrier layer 142A. The formation of conductive structures 136A-136B can include sequential operations of: (i) depositing a hard mask layer 560 (shown in FIG. 5B) on electron barrier layer 142A, (ii) forming openings (not shown) within hard mask layer 560, electron barrier layer 142A, IMD layer 140A, and ESL 138A to expose top surfaces of metal via 134 and gate contact structure 132, (iii) depositing a material of metallic layers 144 to fill the openings, and (iv) chemical mechanical polishing (CMP) hard mask layer 560 and the deposited material extending out of the openings to form the structure of FIG. 5C with top surfaces of metallic layers 144 and electron barrier layer 142A substantially coplanar with each other. The openings can be formed using a wet or dry etch process and the material of metallic layers 144 can be deposited using a CVD process or a electrochemical plating (ECP) process.

Referring to FIG. 4, in operation 425, a diffusion barrier layer is formed on the first metallization layer. For example, as shown in FIG. 5D, diffusion barrier layer 150 can be formed on metallization layer M1 in an operation similar to operation 225 described with reference to FIG. 3F.

Referring to FIG. 4, in operation 430, an ESL and an IMD layer of a second metallization layer of the interconnect structure are formed on the diffusion barrier layer. For example, as shown in FIG. 5D, ESL 138B and IMD layer 140B can be formed on diffusion barrier layer 150 in an operation similar to operation 230 described with reference to FIG. 3F.

Referring to FIG. 4, in operation 435, an electron barrier layer is formed within the IMD layer. For example, as shown in FIG. 5D, electron barrier layer 142B can be formed on IMD layer 140B in an operation similar to operation 240 described with reference to FIG. 3H.

Figure 5E:
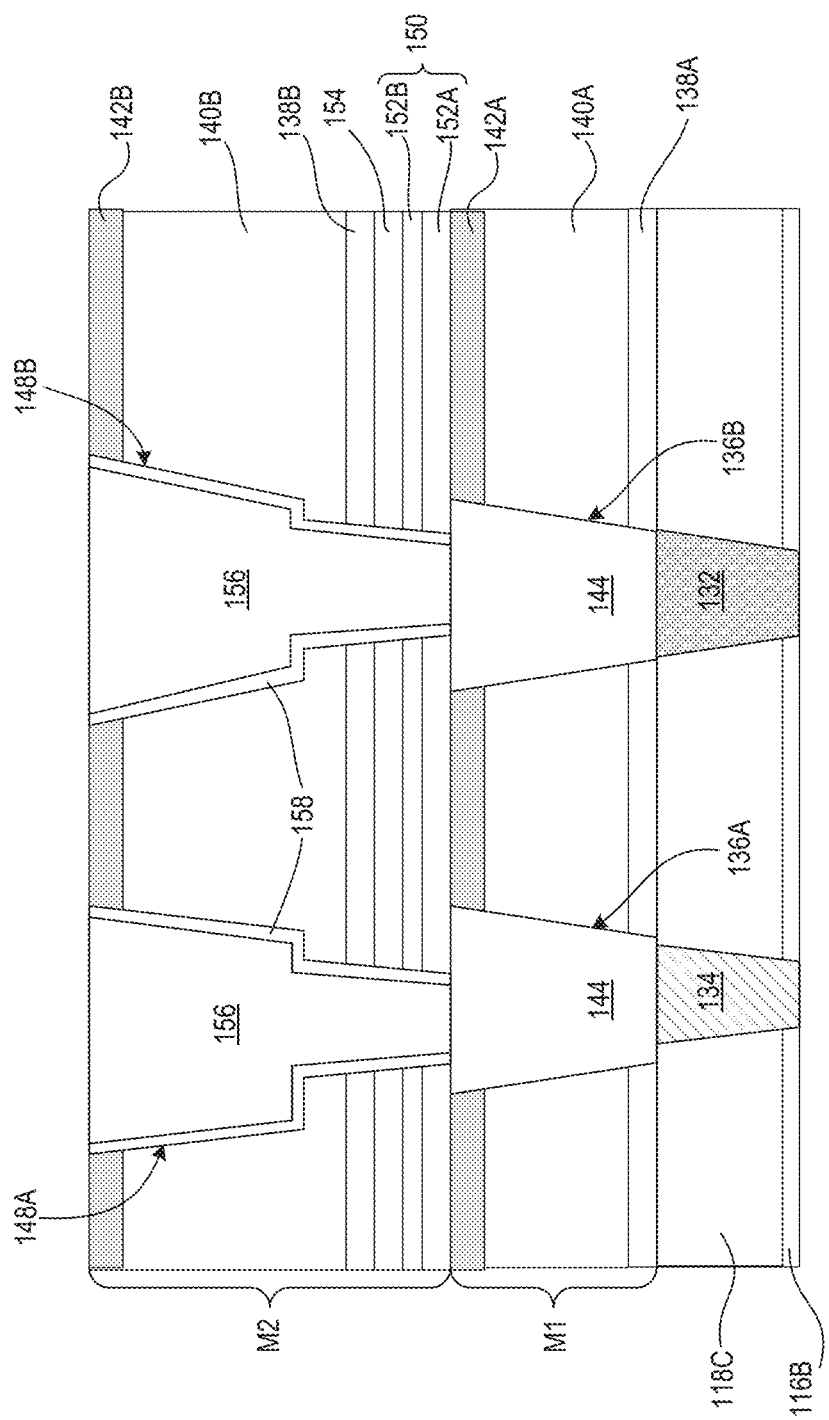

Referring to FIG. 4, in operation 440, conductive structures are formed within the diffusion barrier layer, ESL, IMD layer, and electron barrier layer of the second metallization layer. For example, as shown in FIG. 5E, conductive structures 148A-148B can be formed within diffusion barrier layer 150, ESL 138B, IMD layer 140B, and electron barrier layer 142B using a dual damascene process. The formation of conductive structures 148A-148B can include sequential operations of: (i) depositing hard mask layer 560 (shown in FIG. 5D) on electron barrier layer 142B, (ii) forming openings (not shown) within hard mask layer 560, electron barrier layer 142B, IMD layer 140B, and ESL 138B to expose top surfaces of conductive structures 136A-136B, (iii) depositing metallic liner 158 along sidewalls of the openings, (iv) depositing a material of metallic layers 156 to fill the openings, and (v) chemical mechanical polishing (CMP) hard mask layer 560 and the metallic liner 158 and the material of metallic layers 156 extending out of the openings to form the structure of FIG. 5E with top surfaces of metallic layers 156, metallic liner 158, and electron barrier layer 142B substantially coplanar with each other. The openings can be formed using a wet or dry etch process, metallic liner 158 can be deposited using an atomic layer deposition (ALD) process or a CVD process, and the material of metallic layers 158 can be deposited using a CVD process or a electrochemical plating (ECP) process.

In some embodiments, operations similar to operations 210-240 of method 200 and/or operations 410-440 of method 400 can be performed on planar semiconductor devices, such as MOSFETs to form interconnect structure 100 with conductive structure 136A disposed on a S/D contact structure of the MOSFET and conductive structure 136B disposed on a gate structure of the MOSFET.

The present disclosure provides example structures and methods for improving reliability of interconnect structures (e.g., interconnect structure 100) for semiconductor devices (e.g., finFET 102) in integrated circuits. The reliability of interconnect structures have been negatively impacted by the scaling down of interconnect structures with the scaling down of semiconductor devices. The scaling down of interconnect structures have resulted in smaller electrical isolation regions (e.g., dielectric regions) between adjacent conductive structures (e.g., metal lines and/or metal vias) of the interconnect structures. Such smaller electrical isolation regions may not prevent electron migration between the adjacent conductive structures during the operation of the semiconductor devices. The electron migration can result in current leakage in the interconnect structures, which can lead to degradation of the semiconductor device performance.

In the example methods, portions of the electrical isolation regions (e.g., IMD layers 140A-140B) between the adjacent conductive structures (e.g., conductive structures 136A-136B and 148A-148B) of the interconnect structures can be plasma treated to create an electron barrier layer (e.g., electron barrier layer 142A-142B) with hole carrier induced electron trap sites. The electron trap sites can trap electrons migrating between the adjacent conductive structures during the operation of the semiconductor devices. The plasma treatment can include a plasma process with a high density and low bombardment energy plasma generated using a high plasma source power and a low bias power. In some embodiments, each of the adjacent conductive structures can have a nitride capping layer (e.g., capping layer 146 and 160) that can trap the migrating electrons during the operation of the semiconductor devices. The use of the electron barrier layers and/or the nitride capping layers can improve the reliability of the interconnect structures by about 20 to about 30 times compared to the reliability of interconnect structures without the electron barrier layers and/or the nitride capping layers.

In some embodiments, a method can include forming a contact structure on a transistor and forming a first metallization layer on the contact structure. The forming the first metallization layer can include depositing a first IMD layer on the transistor, forming a first opening within the first IMD layer to expose a top surface of the contact structure, depositing a first metallic layer to fill the opening, forming a first electron barrier layer within the first IMD layer, and forming a first capping layer within the first metallic layer. The first electron barrier layer has a hole carrier concentration higher than a hole carrier concentration of a portion of the first IMD layer underlying the first electron barrier layer. The first capping layer has a hole carrier concentration higher than a hole carrier concentration of a portion of the first metallic layer underlying the first capping layer.

In some embodiments, a method can include forming a contact structure on a transistor, forming a via on the contact structure, depositing a first IMD layer on the transistor, forming a first electron barrier layer within the first IMD layer, and forming a first conductive structure within the first electron barrier layer and the first IMD layer. The first electron barrier layer has a hole carrier concentration higher than a hole carrier concentration of a portion of the first IMD layer underlying the first electron barrier layer. The method can further include depositing a metallic nitride layer on the first electron barrier layer and performing an oxidation process on the metallic nitride layer to convert a top portion of the metallic nitride layer into a metallic oxide layer with an atomic density higher than an atomic density of the metallic nitride layer.

In some embodiments, an interconnect structure can include a first metallization layer disposed on a substrate and a second metallization layer disposed on the first metallization layer. The first metallization layer can include a first IMD layer, a first conductive structure disposed within the IMD layer, and a first electron barrier layer disposed on the first IMD layer. The first electron barrier layer has a hole carrier concentration higher than a hole carrier concentration of the first IMD layer. The second metallization layer can include a diffusion barrier layer disposed on the first metallization layer, a second IMD layer disposed on the diffusion barrier layer, and a second conductive structure disposed within the second IMD layer and the diffusion barrier layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
   a conductive nitride layer disposed on a substrate;
   a first barrier layer disposed on the conductive nitride layer;
   a dielectric layer disposed on the first barrier layer;
   a second barrier layer disposed on the dielectric layer and comprising a nitride of a material of the dielectric layer; and
   a conductive structure disposed in the first barrier layer, the dielectric layer, and the second barrier layer, wherein the conductive structure comprises:
   a conductive layer;
   a conductive capping layer disposed on the conductive layer; and
   a conductive liner disposed on sidewalls of the conductive layer and the conductive capping layer.

2. The interconnect structure of claim 1, wherein the conductive capping layer comprises a nitride of a material of the conductive layer.

3. The interconnect structure of claim 1, wherein the conductive capping layer comprises copper nitride.

4. The interconnect structure of claim 1, wherein the first barrier layer comprises a nitride layer and an oxide layer disposed on the nitride layer.

5. The interconnect structure of claim 1, further comprising an etch stop layer disposed between the first barrier layer and the dielectric layer, wherein an atomic density of a material of the first barrier layer is greater than an atomic density of a material of the etch stop layer.

6. The interconnect structure of claim 1, further comprising a liner-free conductive structure disposed between the conductive nitride layer and the substrate.

7. The interconnect structure of claim 1, wherein the second barrier layer comprises an oxynitride layer.

8. The interconnect structure of claim 1, wherein the conductive structure further comprises a metal line and a metal via;
   wherein the metal line is disposed in the dielectric layer and the second barrier layer; and
   wherein the metal via is disposed in the dielectric layer and the first barrier layer.

9. The interconnect structure of claim 1, wherein a thickness of the conductive capping layer is less than a thickness of the second barrier layer.

10. The interconnect structure of claim 1, wherein top surfaces of the conductive capping layer and the second barrier layer are substantially coplanar with each other.

11. An interconnect structure, comprising:
    an oxide layer;
    a nitride layer disposed on the oxide layer;
    a stack of diffusion barrier layers disposed on the nitride layer;
    a stack of etch stop layers disposed on the stack of diffusion barrier layers; and
    a liner-free conductive structure disposed in the oxide layer and the nitride layer.

12. The interconnect structure of claim 11, wherein the stack of diffusion barrier layers comprises a metal nitride layer and a metal oxide layer disposed on the metal nitride layer.

13. The interconnect structure of claim 11, wherein atomic densities of materials of the stack of diffusion barrier layers are greater than atomic densities of materials of the stack of etch stop layers.

14. The interconnect structure of claim 11, wherein top surfaces of the nitride layer and the liner-free conductive structure are substantially coplanar with each other.

15. The interconnect structure of claim 11, wherein the liner-free conductive structure comprises a metal layer and a capping layer disposed on the metal layer.

16. The interconnect structure of claim 15, wherein the capping layer comprises a nitride of the metal layer.

17. A method, comprising:
    depositing a dielectric layer on a substrate;
    depositing a conductive layer in the dielectric layer;
    converting a portion of the dielectric layer into a first nitride layer;

converting a portion of the conductive layer into a second nitride layer; and forming a diffusion barrier layer on the first and second nitride layers.

18. The method of claim 17, wherein converting the portion of the dielectric layer comprises performing a nitridation process on the dielectric layer.

19. The method of claim 17, wherein converting the portion of the conductive layer comprises performing a nitridation process on the conductive layer.

20. The method of claim 17, wherein forming the diffusion barrier layer comprises:

depositing a metal nitride layer on the first and second nitride layers; and performing an oxidation process on the metal nitride layer.

* * * * *

UNITED STATES PATENT AND TRADEMARK OFFICE
CERTIFICATE OF CORRECTION

| | | |
|---|---|---|
| PATENT NO. | : 12,444,647 B2 | Page 1 of 1 |
| APPLICATION NO. | : 18/227726 | |
| DATED | : October 14, 2025 | |
| INVENTOR(S) | : Chen et al. | |

It is certified that error appears in the above-identified patent and that said Letters Patent is hereby corrected as shown below:

On the Title Page

Item (63), under "Related U.S. Application Data", Line 2, delete "2022," and insert -- 2022, now Pat. No. 12,354,907, --, therefor.

In the Specification

In Column 7, Line 20, delete "(10)" and insert -- (IO) --, therefor.

Signed and Sealed this
Eighteenth Day of November, 2025

John A. Squires
*Director of the United States Patent and Trademark Office*